(12) United States Patent
Sakakibara et al.

(10) Patent No.: US 6,451,458 B1
(45) Date of Patent: Sep. 17, 2002

(54) ELECTROLUMINESCENT MATERIAL AND ELECTROLUMINESCENT CELL

(75) Inventors: Mitsuhiko Sakakibara, Tsuchiura; Yasumasa Takeuchi, Yokohama, both of (JP); Ding-kuo Ding, Taichung (TW)

(73) Assignees: JSR Corporation, Tokyo (JP); International Center for Materials Research, Kawasaki (JP); TECO Electric & Machinery Co., Ltd., Taipei (TW)

( * ) Notice: Subject to any disclaimer, the term of this patent is extended or adjusted under 35 U.S.C. 154(b) by 0 days.

(21) Appl. No.: 09/450,127

(22) Filed: Nov. 26, 1999

(30) Foreign Application Priority Data

Nov. 27, 1998 (JP) ............................................ 10-337311

(51) Int. Cl.[7] ........................ H05B 33/14; C09K 11/00
(52) U.S. Cl. ...................... 428/690; 917/704; 917/323; 313/504; 313/506; 525/280; 525/88; 525/89; 525/93; 526/258; 526/259; 526/260; 526/266; 526/270; 252/301.35; 257/40; 257/103
(58) Field of Search ................................ 428/690, 704, 428/917, 328, 323; 313/504, 506; 525/280, 88, 89, 93; 526/258, 259, 260, 266, 270; 252/301.35; 257/40, 103

(56) References Cited

U.S. PATENT DOCUMENTS 5,281,489 A * 1/1994 Mori et al. .................. 428/690
5,879,821 A * 3/1999 Hsieh .......................... 428/690
6,007,928 A   12/1999 Sakakibara et al.

OTHER PUBLICATIONS

Patent Abstract of Japan, JP 9–255725, Sep. 30, 1997.

* cited by examiner

Primary Examiner—Cynthia H. Kelly
Assistant Examiner—Ling Xu
(74) Attorney, Agent, or Firm—Oblon, Spivak, McClelland, Maier & Neustadt, P.C.

(57) ABSTRACT

An electroluminescent cell which exhibits a high luminous efficiency and excellent durability is provided. The electroluminescent material comprises a unit (AB) which is formed by alternate copolymerization of hole transfer monomers and electron transfer monomers, and a unit (A) which is formed by the polymerization of hole transfer monomers, wherein the molar ratio of the total of the structural units originating from the hole transfer monomers and the structural units originating from the electron transfer monomers in the unit (AB) and the structural units originating from the hole transfer monomers in the unit (A) is from 50:50 to 5:95. The electroluminescent cell has an anode layer 2, an electroluminescent material layer 3 made from the electroluminescent material, an electron transfer luminous layer 4, and a cathode layer 5.

23 Claims, 1 Drawing Sheet

ELECTROLUMINESCENT MATERIAL AND ELECTROLUMINESCENT CELL

BACKGROUND OF THE INVENTION

1. Field of the Invention

The present invention relates to an electroluminescent material for forming electroluminescent cells, and to an electroluminescent cell.

2. Description of the Background Art

Use of organic materials as a hole transfer material and an electron transfer material for forming an electroluminescent cell has begun in recent years. Organic electroluminescent cells using such organic materials are being vigorously researched.

Organic materials that constitute such an organic electroluminescent cell are required to possess superior durability and high luminous efficiency.

Conventionally, as an organic material possessing a hole transfer capability, diamine derivatives which include low molecule organic materials such as aryl amine compounds, for example, N,N'-diphenyl-N,N'-di(3-methylphenyl)-4,4'-diaminobiphenyl (hereinafter also referred to as "TPD"), and macromolecule organic materials such as polyvinyl carbazole are known.

However, the above-mentioned low molecular weight organic materials lack physical or thermal durability. A hole transfer layer based on such low molecular weight materials tends to deteriorate while the organic electroluminescent cells are in use or in storage.

On the other hand, macromolecule organic materials such as polyvinyl carbazole have a very high glass transition temperature (Tg) which provides a hole transfer layer with excellent durability. However, they present problems in actual application, requiring a very high drive voltage and yet yielding a low luminous efficiency due to a deficiency in hole transfer capability.

Although 2-(4-biphenylyl)-5-(4-tert-butylphenyl)-1,3,4-oxadiazole (hereinafter also referred to as "PBD") is known as an electron transfer material, thin films made of PBD lack stability.

Japanese Patent Application Laid-open No. 255725/1997 discloses a copolymer of oxadiazole and aromatic diamine or vinyl carbazole. Although the copolymer of this patent is a bipolar-type and forms a monolayer electroluminescent cell, the resulting cell exhibits insufficient luminous brightness and durability.

SUMMARY OF THE INVENTION

In consideration of the above circumstances, a first object of the present invention is to provide an electroluminescent material having a high luminous efficiency and excellent durability.

A second object of the present invention is to provide an electroluminescent cell which exhibits a high luminous efficiency and excellent durability.

The electroluminescent material of the present invention comprises a unit (AB) which is formed by alternate copolymerization of hole transfer monomers and electron transfer monomers, and a unit (A) which is formed by the polymerization of hole transfer monomers, wherein the molar ratio of the total of the structural units originating from the hole transfer monomers and the structural units originating from the electron transfer monomers in the unit (AB), and the structural units originating from the hole transfer monomers in the unit (A) is from 50:50 to 5:95.

The electroluminescent material of the present invention may be a block copolymer comprising a block component consisting of the unit (AB) and a block component consisting of the unit (A).

Furthermore, the electroluminescent material of the present invention may be a resin composition comprising a copolymer consisting of the unit (AB) and a polymer consisting of the unit (A).

Moreover, the electroluminescent material of the present invention may be a resin composition comprising a block copolymer which comprises a block component consisting of the unit (AB) and a block component consisting of the unit (A), a copolymer consisting of the unit (AB), and a polymer consisting of the unit (A).

The electroluminescent cell of the present invention comprises an anode layer, an electroluminescent material layer made of the above-mentioned electroluminescent material, an electron transfer luminous layer, and a cathode layer. The present invention will now be described in more detail by way of embodiments.

Other objects, features and advantages of the invention will hereinafter become more readily apparent from the following description.

DETAILED DESCRIPTION OF THE INVENTION AND PREFERRED EMBODIMENTS

Figure 1:
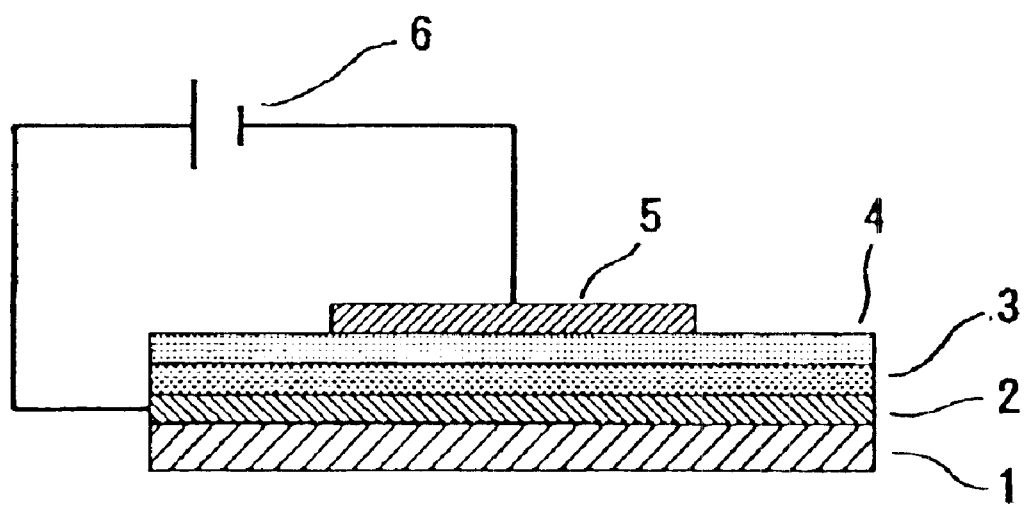
FIG. 1 is an illustrative sectional view describing an example of an electroluminescent cell of the present invention.

The present invention will now described in more detail by way of embodiments.

Electroluminescent Material

The electroluminescent material of the present invention comprises a unit (AB) which is formed by alternate copolymerization of hole transfer monomers and electron transfer monomers and a unit (A) which is formed by the polymerization of hole transfer monomers.

As hole transfer monomers, carbazole derivatives such as N-vinylcarbazole, 3,6-dimethyl-9-vinylcarbazole, 3,6-diethyl-9-vinylcarbazole, 3-methyl-9-vinylcarbazole, and 3-ethyl-9-vinylcarbazole can be used.

Among these, N-vinylcarbazole and 3,6-dimethyl-9-vinylcarbazole are desirable.

As electron transfer monomers, oxadiazole derivatives such as 2-β-naphthyl-5-(4-vinylphenyl)-1,3,4-oxadiazole, 2-α-naphthyl-5-(4-vinylphenyl)-1,3,4-oxadiazole, 2-phenyl-5-(4-vinylphenyl)-oxadiazole, and 2-(p-phenylphenyl)-5-(4-vinylphenyl)-oxadiazole can be used.

Among these, 2-α-naphthyl-5-(4-vinylphenyl)-1,3,4-oxadiazole is preferable.

In the electroluminescent material of the present invention, the molar ratio of the total of the structural units originating from the hole transfer monomers and the structural units originating from the electron transfer monomers in the unit (AB), and the structural units originating from the hole transfer monomers in the unit (A) is from 50:50 to 5:95, and preferably from 40:60 to 10:90.

If the ratio of the structural units originating from the unit (AB) is too small, the resulting electroluminescent material exhibits only insufficient hole trap performance. If the ratio of the structural units originating from the unit (A) is too small, on the other hand, the resulting electroluminescent material exhibits only insufficient electron trap performance.

The unit (AB) and unit (A) may be present in any form in the present invention. For example, they may be present as block components which form block copolymers, or may be present as polymers. Specifically, the electroluminescent material of the present invention comprises the following embodiments (1) to (3).

First embodiment: A block copolymer comprising a block component which is formed by the alternate copolymerization of hole transfer monomers and electron transfer monomers (unit (AB)), and a block component which is formed by the polymerization of hole transfer monomers (unit (A)).

Second embodiment: A resin composition comprising a copolymer which is formed by the alternate copolymerization of hole transfer monomers and electron transfer monomers (unit (AB)) and a polymer which is formed by the polymerization of hole transfer monomers (unit (A)).

Third embodiment: A resin composition comprising: a block copolymer which comprises a block component formed by the alternate copolymerization of hole transfer monomers and electron transfer monomers (unit (AB)) and a block component formed by the polymerization of hole transfer monomers (unit (A)); a copolymer formed by the alternate copolymerization of hole transfer monomers and electron transfer monomers (unit (AB)); and a copolymer formed by the polymerization of hole transfer monomers (unit (A)).

First Embodiment

The electroluminescent material of the first embodiment comprises a block copolymer comprising a block component which is formed by the alternate copolymerization of hole transfer monomers and electron transfer monomers (such a block component may be called "block component (ab)"), and a block component which is formed by the polymerization of hole transfer monomers (such a block component may be called "block component (a)"). Such a block copolymer of the first embodiment may be called "specific block copolymer".

The weight average polymerization degree of the block component (ab) in a specific block copolymer is preferably from 5 to 5,000.

If the weight average polymerization degree is less than 5, the resulting electroluminescent material tends to exhibit insufficient heat resistance and insufficient stability. If the weight average polymerization degree is more than 5,000, on the other hand, the resulting electroluminescent material tends to have a remarkably high solution viscosity.

The weight average polymerization degree of the block component (a) in a specific block copolymer is preferably from 10 to 5,000.

If the weight average polymerization degree is less than 10, the resulting electroluminescent material tends to exhibit insufficient heat resistance and poor mechanical strength. If the weight average polymerization degree is more than 5,000, on the other hand, the resulting electroluminescent material tends to have a remarkably high solution viscosity.

The polystyrene-reduced weight average molecular weight of the specific block copolymer measured by gel permeation chromatography is from 1,000 to 1,000,000, and preferably from 10,000 to 500,000.

If the weight average molecular weight is less than 1,000, the resulting electroluminescent material may exhibit insufficient heat resistance, poor stability in the thin film state, and weak mechanical strength. On the other hand, if the weight average molecular weight is more than 1,000,000, the resulting electroluminescent material has an remarkably high solution viscosity, exhibits poor handling characteristics during the fabrication of electroluminescent cells, and produces stringy solutions.

The specific block copolymer can be prepared by producing a living polymer of hole transfer monomers and electron transfer monomers by copolymerizing these monomers under the conditions where these monomers alternately copolymerize, and causing hole transfer monomers to polymerize on the resulting living polymer. Either a living cationic polymerization method or a living radical polymerization method can be preferably employed for the living polymerization.

In the preparation of the specific block copolymer by a living cationic polymerization method, a cationic living polymer is first produced by the alternate copolymerization of hole transfer monomers and electron transfer monomers in the presence of a cationic polymerization catalyst, then hole transfer monomers are cationically polymerized with this cationic living polymer.

As the polymerization medium in this method, a halogenated hydrocarbon such as methylene chloride or chlorobenzene, an ether solvent such as dibutyl ether, diphenyl ether, dioxane, or tetrahydrofuran, or a highly polar solvent such as acetonitrile, nitrobenzene, and the like may be used.

As the cationic polymerization catalyst, $HI\text{-}ZnI_2$, $I_2$, $I_2\text{-}HI$, and the like, as well as a catalyst comprising a Lewis acid such as a metal halide-ether complex and a base may be used. The amount of the cationic polymerization catalyst used is from 0.0001 to 0.5 mol for 1 mol of the total of hole transfer monomers and electron transfer monomers to be initially polymerized.

The reaction temperature is from $-150°$ C. to $50°$ C., for example.

The hole transfer monomers to produce the block component (a) may be added to the reaction system after the formation of the cationic living polymer (the block component (ab)) as mentioned above. It is also possible to add the hole transfer monomers to the reaction system before the formation of the cationic living polymer.

In the preparation of the specific block copolymer by a living radical polymerization method, a radical living polymer may be first produced by the alternate copolymerization of hole transfer monomers and electron transfer monomers in the presence of a radical polymerization catalyst, then hole transfer monomers are radically polymerized with this radical living polymer.

As the polymerization medium in the above process, an amide solvent such as dimethylformamide, dimethylacetoamide, or N-methylpyrrolidone, a hydrocarbon solvent such as benzene, toluene, xylene, hexane, or cyclohexane, an ester solvent such as γ-butyrolactone or ethyl lactate, or a ketone solvent such as cyclohexylbenzophenone or cyclohexanone, and the like may be used.

As the radical polymerization catalyst, a system based on a peroxide and an N-oxy radical such as 4-methylsulfonyloxy-2,2', 6,6'-tetramethyl-1-piperidine-N-oxide, 2,2', 5,5'-tetramethylpirrolidine oxide, 4-oxo-2,2', 6,6'-tetramethyl-1-piperidine-N-oxide and the like, or a sulfide system catalyst may be used. The amount of the radical polymerization catalyst used is from 0.0001 to 0.5 mol for 1 mol of the monomer.

The reaction temperature is governed by the energy required to cause the end-protected living group to dissociate, and may be from −10° C. to 150° C., for example. The hole transfer monomers to produce the block component (a) may be added to the reaction system after the formation of the radical living polymer (the block component (ab)) as mentioned above. It is also possible to add the hole transfer monomers to the reaction system before the formation of the radical living polymer.

Second Embodiment

The electroluminescent material of the second embodiment is a resin composition formed from a copolymer produced by the alternate copolymerization of hole transfer monomers and electron transfer monomers (such a copolymer may be called "copolymer (ab)"), and a polymer formed by the polymerization of hole transfer monomers (such a polymer maybe called "polymer (a)").

The copolymer (ab) can be obtained by copolymerizing the hole transfer monomers and electron transfer monomers under the conditions wherein these monomers copolymerize alternately.

The polystyrene-reduced weight average molecular weight of the copolymer (ab) measured by gel permeation chromatography is from 1,150 to 1,000,000, and preferably from 11,500 to 500,000.

If the weight average molecular weight is less than 1,150, the resulting electroluminescent material may exhibit insufficient heat resistance, poor stability in the thin film state, and weak mechanical strength. On the other hand, if the weight average molecular weight is more than 1,000,000, the resulting electroluminescent material has an remarkably high solution viscosity, exhibits poor handling characteristics during the fabrication of electroluminescent cells, and produces stringy solutions.

Various alternate polymerization methods can be applied to the copolymerization of the hole transfer monomers and electron transfer monomers. Such a method includes, for example, a radical polymerization method, anionic or cationic polymerization method, and preferably a corresponding living radical polymerization method, living anionic polymerization method, and living cationic polymerization method.

Peroxides such as benzoyl peroxide or t-butyl hydroperoxide, and azo compounds such as 1,1'-azobis(1-acetoxy-1-phenylethane), azobisisobutyronitrile, or azobisisoburate can be used as a radical polymerization catalyst to prepare the copolymer (ab) by radical polymerization. Among these, 1,1'-azobis(1-acetoxy-1-phenylethane) and azobisisobutyronitrile are desirable. The amount of the radical polymerization catalyst used is from 0.0001 to 0.5 mol for 1 mol of the monomer.

As the polymerization medium in the polymerization reaction, an amide solvent such as dimethylformamide, dimethylacetoamide, or N-methylpyrrolidone, a hydrocarbon solvent such as benzene, toluene, xylene, hexane, or cyclohexane, an ester solvent such as γ-butyrolactone and ethyl lactate, a ketone solvent such as cyclohexylbenzophenone or cyclohexanone, and cyclic ethers such as tetrahydrofuran can be used.

The reaction temperature is from 0° C. to 100° C., for example.

Alkali metal compounds such as naphthalene potassium, naphthalene lithium, and butyl lithium, and alkaline earth metal compounds such as art-type complex of balium and aluminum can be used as an anionic polymerization catalyst to prepare the copolymer (ab) by the anionic polymerization. Of these, butyl lithium and naphthalene lithium are preferable. The amount of the anionic polymerization catalyst used is from 0.0001 to 0.1 mol for 1 mol of the monomer.

As a polymerization solvent, aromatic hydrocarbons such as toluene and benzene, aliphatic hydrocarbons such as hexane and heptane, and ether compounds such as tetrahydrofuran may be used. The reaction temperature is from 0° C. to 100° C., for example.

An ether complex of boron fluoride, a halogen compound such as hydrogen iodide, and a halogenated metal compound such as tin tetrachloride can be used as a cationic polymerization catalyst to prepare the copolymer (ab) by the cationic polymerization. Among these, an ether complex of boron fluoride, hydrogen iodide, and tin tetrachloride are preferred. The amount of the cationic polymerization catalyst used is from 0.0001 to 0.1 mol for 1 mol of the monomer.

As the polymerization medium in this method, a halogenated hydrocarbon such as methylene chloride or chlorobenzene, an aliphatic ether solvent such as dibutyl ether, a cyclic ether solvent such as diphenyl ether, dioxane, or tetrahydrofuran, a highly polar solvent such as acetonitrile, nitrobenzene, and the like may be used.

The reaction temperature is from −150° C. to 50° C., for example.

<Polymer (a)>

Polymer (a) can be obtained by the polymerization of hole transfer monomers.

The polystyrene-reduced weight average molecular weight of the polymer (a) measured by gel permeation chromatograph is from 1,000 to 1,000,000, and preferably from 5,000 to 500,000.

If the weight average molecular weight is less than 1,000, the resulting electroluminescent material may exhibit insufficient heat resistance, poor stability in the thin film state, and weak mechanical strength. On the other hand, if the weight average molecular weight is more than 1,000,000, the resulting electroluminescent material has an remarkably high solution viscosity, exhibits poor handling characteristics during the fabrication of electroluminescent cells, and produces stringy solutions.

Various polymerization methods can be used for the polymerization of hole transfer monomers. Such a method includes, for example, a radical polymerization method, anionic or cationic polymerization method, corresponding living radical polymerization method, and preferably, a living anionic polymerization method, and living cationic polymerization method.

Commonly known radical polymerization catalysts, for example, azo compounds such as azobisisobutyronitrile, peroxides such as benzoyl peroxide (BPO), and dithiocarbamate derivatives such as tetraethyl thiuram disulfide can be used in the preparation of polymer (a) by the radical polymerization. The living radical polymerization using a catalyst system, which is a combination of an N-oxy radical such as 2,2,6,6-tetramethyl-1-piperidine-N-oxide (TEMPO) and a radical initiator, is particularly desirable. The amount of the radical polymerization catalyst used is from 0.0001 to 0.5 mol for 1 mol of the monomer.

As the polymerization medium in the polymerization reaction, an amide solvent such as dimethylformamide, dimethylacetoamide, or N-methylpyrrolidone, a hydrocarbon solvent such as benzene, toluene, xylene, hexane, or cyclohexane, an ester solvent such as γ-butyrolactone or ethyl lactate, a ketone solvent such as cyclohexylbenzophenone or cyclohexanone, and cyclic ethers such as tetrahydrofuran can be used.

The reaction temperature is from −10° C. to 150° C., for example.

Organometallic compounds of a metal such as an alkali metal or alkaline earth metal can be used as an anionic polymerization catalyst in the anionic polymerization reaction to obtain the polymer (a). Examples of such a catalyst include an alfin catalyst such as naphthyl sodium, an alkyl lithium such as methyl lithium, ethyl lithium, n-butyl lithium, and sec-butyl lithium, an aryl lithium such as phenyl lithium, an alkyl zinc such as diethylzinc, and an art complex such as lithium alkyl magnesium or lithium alkyl balium. Of these, organiolithium compounds such as n-butyl lithium, sec-butyl lithium, and phenyl lithium are preferable.

As a polymerization solvent, hydrocarbons such as benzene, toluene, hexane, heptane, or cyclohexane, ether compounds such as tetrahydrofuran or dioxane may be used.

The reaction temperature is from −50° C. to 100° C., for example.

Commonly known cationic polymerization catalysts, for example, a Lewis acid such as trifluoroborate or tin tetrachloride, an inorganic acid such as sulfuric acid or hydrochloric acid, and a cationic exchange resin can be used as a cationic polymerization catalyst to prepare the polymer (a) by the cationic polymerization. Living cationic polymerization using a catalyst such as HI, HI-ZnI$_2$, or the like is particularly preferable. The amount of the cationic polymerization catalyst used is from 0.0001 to 0.1 mol for 1 mol of the monomer.

As the polymerization medium in this method, a halogenated hydrocarbon such as methylene chloride or chlorobenzene, an aliphatic ether solvent such as dibutyl ether, a cyclic ether solvent such as diphenyl ether, dioxane, or tetrahydrofuran, a highly polar solvent such as acetonitrile or nitrobenzene, and the like may be used. The reaction temperature is from −150° C. to 50° C., for example.

In the second embodiment, the electroluminescent material can be obtained by mixing said copolymer (ab) and said polymer (a).

There are no specific limitations to the ratio of copolymer (ab) and polymer (a), insofar as the molar ratio of the total of the structural units originating from the hole transfer monomers and the structural units originating from the electron transfer monomers in the copolymer (ab) and the structural units originating from the hole transfer monomers in the polymer (a) is from 50:50 to 5:95. Such a ratio, however, should usually be from 10 to 1,000 parts by weight, and preferably from 100 to 800 parts by weight of the polymer (a) for 100 parts by weight of the copolymer (ab).

Third Embodiment

In the third embodiment, the electroluminescent material is a resin composition which comprises the specific block copolymer, copolymer (ab), and polymer (a), and can be obtained by mixing these components.

There are no specific limitations to the ratio of the specific block copolymer, copolymer (ab), and polymer (a), insofar as the molar ratio of the total of the structural units originating from the hole transfer monomers and the structural units originating from the electron transfer monomers in each of the specific block copolymer, copolymer (ab), and polymer (a), and the structural units originating from the hole transfer monomers in each of the specific block copolymer, copolymer (ab), and polymer (a) is from 50:50 to 5:95. Such a ratio, however, should usually be from 10 to 1,000 parts by weight, and preferably from 100 to 800 parts by weight of the copolymer (ab), and from 50 to 1,000 parts by weight, and preferably from 100 to 800 parts by weight of the polymer (a), respectively for 100 parts by weight of the specific block copolymer.

Electroluminescent Cells

The electroluminescent cell of the present invention comprises an anode layer (a hole injection electrode layer) 2 which is provided on a transparent substrate 1, an electroluminescent material layer 3 which is made of the above-mentioned electroluminescent material and is provided on the anode layer 2, an electron transfer luminous layer 4 which is provided on the electroluminescent material layer 3, and a cathode layer (an electron injection electrode layer) 5 which is provided on the electron transfer luminous layer 4. The anode layer 2 and the cathode layer 5 are connected to a DC power source 6.

In this construction, a glass substrate, transparent resin substrate, quartz glass substrate, or the like can be used as the transparent substrate 1.

As the anode layer 2, a material with a large work function (for example, 4 eV or more) such as an ITO membrane, tin oxide ($SnO_2$) membrane, copper oxide (CuO) membrane, zinc oxide (ZnO) membrane, and the like can be used.

A metal complex of hydroxyquinoline typified by tris-quinolinolate aluminum, a metal complex compound of hydroxybenzoxazole or hydroxybenzthiazole, and the like can be used as a material for forming the electron transfer luminous layer 4. As the cathode layer 5, a material with a small work function (for example, 4 eV or less) such as a membrane of metal such as aluminum, calcium, magnesium, or lithium, or a metal alloy membrane containing these metals can be used.

Although there are no specific restrictions as to the thickness of the electroluminescent material layer 3 and the electron transfer luminous layer 4, such a thickness may be selected from the range usually from 1 to 1,000 nm, and preferably from 10 to 200 nm.

The electroluminescent material layer 3 of the electroluminescent cell can be formed by the following method, for example. First, a coating solution of the electroluminescent material of the present invention dissolved in a suitable solvent is prepared. This coating solution is applied to the surfaces of the anode layer 2 formed on the transparent substrate 1, and the organic solvent in the coating is removed, thereby producing the electroluminescent material layer 3.

In the above process, an organic solvent which can dissolve the electroluminescent material, i.e. the specific block copolymer, copolymer (ab), or polymer (a), can be used as a solvent for preparing the coating solution. Given as specific examples are aromatic hydrocarbon solvents such as toluene, xylene, and mesitylene; halogenated hydrocarbon solvents such as chloroform, chlorobenzene, and tetrachloroethane; amide solvents such as dimethylformamide, N-methyl pyrrolidone, and dimethylacetamide; ketones such as 2-methyl amyl ketone, 2-ethyl amyl ketone, and cyclohexanone; ethyl lactate, propylene glycol monoethylacetate, ethyl ethoxypropionate, and tetrahydrofuran. These organic solvents may be used either individually or in combinations of two or more. Among these organic solvents, those exhibiting a suitable evaporation rate and having a boiling point in the range from 70 to 150° C. are preferable because of their capability of producing membranes with a uniform thickness.

The electroluminescent material is used usually in an amount sufficient to produce a coating solution with a concentration from 0.1 to 10 wt %, although the specific amount varies according to the type of electroluminescent material.

Spin coating, dip coating, roll coating, and the like can be given as the method for applying the coating solution.

In the above electroluminescent cell, the electroluminescent material layer 3 and the electron transfer luminous layer 4 emit light when a DC voltage is applied between the anode layer 2 and the cathode layer 5 by the DC power source 6. The light radiates via the anode layer 2 and the glass substrate 1.

Because this electroluminescent cell has the electroluminescent material layer 3 comprising the unit (AB) which is formed by alternate copolymerization of hole transfer monomers and electron transfer monomers, and the unit (A) which is formed by the polymerization of hole transfer monomers, the cell can exhibit efficient hole transfer capability and electron transfer capability. As a result, the electroluminescent cell can provide high light emitting efficiency, exhibits superior durability, and has a long use life.

EXAMPLES

The present invention will now be described in detail by way of examples, which should not be construed as limiting the present invention. In the Examples, "part(s)" means "part(s) by weight".

Preparation Example 1

9.5 mmol of N-vinylcarbazole and 0.5 mmol of 2-β-naphthyl-5-(4-vinylphenyl)-1,3,4-oxadiazole were placed in a 50 ml pressure bottle, of which the internal atmosphere was repeatedly replaced by nitrogen gas. After the addition of 0.1 mmol of azobis (1-acetoxyphenylethane) and 10 ml of dimethyl formamide, monomers were polymerized at 60° C. for 10 hours, thereby obtaining a specific block copolymer comprising a block component (ab), which is an alternate polymerization product of N-vinylcarbazole and 2-β-naphthyl-5-(4-vinylphenyl)-1,3,4-oxadiazole, and a block component (a) which is a polymerization product of N-vinylcarbazole.

The composition of the reaction mixture was analyzed at a certain interval during the polymerization to confirm that N-vinylcarbazole and 2-β-naphthyl-5-(4-vinylphenyl)-1,3,4-oxadiazole were polymerized alternately. The resulting specific block copolymer is designated as specific block copolymer (1).

An analysis of the specific block copolymer has shown that the molar ratio of the total of the structural unit originating from N-vinylcarbazole and the structural unit originating from 2-β-naphthyl-5-(4-vinylphenyl)-1,3,4-oxadiazole in the block component (ab) and the structural unit originating from N-vinylcarbazole in the block component (a) was 10:90. It was further confirmed that the weight average polymerization degree of the block component (ab) was 30, the weight average polymerization degree of the block component (a) was 60, and the polystyrene-reduced weight average molecular weight of the specific block copolymer determined by gel permeation chromatography (solvent: tetrahydrofuran) was 58,000.

Preparation Examples 2–3
<Preparation of specific block copolymers>

Block copolymers were prepared in the same manner as in Preparation Example 1 except that N-vinylcarbazole and 2-β-naphthyl-5-(4-vinylphenyl)-1,3,4-oxadiazole were used in the amounts shown in Table 1 below. The specific block copolymers obtained in the Preparation Examples 2 and 3 are designated as specific block copolymers 2 and 3, respectively. The molar ratio of the total of the structural unit originating from N-vinylcarbazole and the structural unit originating from 2-β-naphthyl-5-(4-vinylphenyl)-1,3,4-oxadiazole in the block component (ab) and the structural unit originating from N-vinylcarbazole in the block component (a), and the weight average molecular weight of the specific block copolymers (2) and (3) are shown in Table 1.

Preparation Example 4
<Preparation of copolymer (ab)>

A copolymer (ab) in which N-vinylcarbazole and 2-β-naphthyl-5-(4-vinylphenyl)-1,3,4-oxadiazole are alternately polymerized was prepared in the same manner as in Preparation Example 1 using 5.0 mmol of N-vinylcarbazole and 5.0 mmol of 2-β-naphthyl-5-(4-vinylphenyl)-1,3,4-oxadiazole. The polystyrene-reduced weight average molecular weight of the resulting copolymer (ab) determined by gel permeation chromatography (solvent: tetrahydrofuran) was 19,000.

Preparation Example 5
<Preparation of polymer (a)>

A polymer (a) which is an N-vinylcarbazole polymer was prepared in the same manner as in Preparation Example 1 using 10.0 mmol of N-vinylcarbazole. The polystyrene-reduced weight average molecular weight of the resulting polymer (a) determined by gel permeation chromatography (solvent: tetrahydrofuran) was 180,000.

TABLE 1

|  | Preparation Example | | | | |
| --- | --- | --- | --- | --- | --- |
|  | 1 | 2 | 3 | 4 | 5 |
| NVK (mmol) *1 | 9.5 | 9.0 | 8.0 | 5.0 | 10.0 |
| OXD (mmol) *2 | 0.5 | 1.0 | 2.0 | 5.0 | — |
| Polymerization degree |  |  |  |  |  |
| Block component (ab) | 30 | 55 | 110 | — | — |
| Block component (a) | 600 | 550 | 500 | — | — |
| Weight average molecular weight | 58000 | 28000 | 32000 | 19000 | 18000 |
| Molar ratio *3 |  |  |  |  |  |
| Block component (ab) | 10 | 20 | 40 | 100 | 0 |
| Block component (a) | 90 | 80 | 60 | 0 | 100 |

*1 N-vinylcarbazole
*2 2-β-naphthyl-5-(4-vinylphenyl)-1,3,4-oxadiazole
*3 Molar ratio of the structural unit of the block component (ab) and the structural unit of the block component (a)

Comparative Preparation Example
<Preparation of polymer from electron transfer monomers>

The internal atmosphere of a 50 ml glass-made pressure container was completely replaced by nitrogen, and 10 mmol of 2-β-naphthyl-5-(4-vinylphenyl)-1,3,4-oxadiazole and 9 ml of N,N-dimethylformamide were added to the bottle in a nitrogen stream, followed by the addition of 0.2 mmol of azobisisobutyronitrile while stirring. The monomer was polymerized for 10 hours at 70° C. to obtain a polymer of 2-β-naphthyl-5-(4-vinylphenyl)-1,3,4-oxadiazole. This polymer is designated as Polymer (b).

The polystyrene-reduced weight average molecular weight of the Polymer (b) determined by gel permeation chromatography (solvent: tetrahydrofuran) was 18,000.

Example 1

To use the specific block copolymer (1) prepared in the Preparation Example 1 as an electroluminescent material, 1 part of this block copolymer (1) was dissolved in 200 parts of a chloroform-chlorobenzene (8:2 by weight) mixed solvent, thereby producing a coating solution.

The coating solution was then spin-coated on a 5 by 5 cm glass substrate on which an ITO film (anode layer) was formed, and the organic solvent was removed to leave an electroluminescent material layer having a thickness of 50 nm. An electron transfer light emitting layer of trisquinolinolate aluminum with a thickness of 60 nm was formed on the electroluminescent material layer, following which a 5 mm×5 mm magnesium/silver (10:1 by weight) alloy membrane with a thickness of 100 nm (cathode layer) was formed by vacuum deposition on the electron transfer light emitting layer, thereby obtaining an electroluminescent cell with a structure shown in FIG. 1.

Examples 2–3

Electroluminescent cells were prepared in the same manner as in Example 1, except for using the specific block copolymers (2) and (3) which were obtained in Preparation Examples 2 and 3 as electroluminescent materials.

Example 4

An electroluminescent cell was prepared in the same manner as in Example 1, except for using, as an electroluminescent material, a mixture of the copolymer (ab) obtained in Preparation Example 4 and the polymer (a) obtained in Preparation Example 5 at a ratio so that the molar ratio of the structural unit of the copolymer (ab) and the structural unit of the polymer (a) was 20:80.

Example 5

An electroluminescent cell was prepared in the same manner as in Example 1, except for using, as an electroluminescent material, a mixture of 0.1 mmol (converted to the amount of monomers, hereinafter the same) of the specific block copolymer obtained in Preparation Example 2, 0.2 mmol of the copolymer (ab) obtained in Preparation Example 4, and 0.7 mmol of the polymer (a) obtained in Preparation Example 5.

Comparative Example 1

An electroluminescent cell was prepared in the same manner as in Example 1, except for using the polymer (b) obtained in the Comparative Preparation Example as an electroluminescent material.

Comparative Example 2

An electroluminescent cell was prepared in the same manner as in Example 1, except for using the copolymer (ab) which was obtained in Preparation Example 4 as an electroluminescent materials.

Evaluation of electroluminescent cells (1) Luminous brightness

The electroluminescent cells prepared in Examples 1–6 and Comparative Examples were caused to emit light by applying a DC voltage in the range of 0–30 V, and their luminous brightness was measured using a luminometer (LS-100, manufactured by Minolta Camera Co., Ltd.).

(2) Durability

The electroluminescent cells prepared in Examples 1–6 and Comparative Examples were caused to continuously emit light starting from an initial luminosity of 300 cd/cm$^2$, and the period of time until the luminosity was reduced to one half of the initial luminosity (half-life) was measured.

The results are shown in Table 2.

TABLE 2

|  | Example | | | | | Comparative Example | |
| --- | --- | --- | --- | --- | --- | --- | --- |
|  | 1 | 2 | 3 | 4 | 5 | 1 | 2 |
| Molar ratio *4 | | | | | | | |
| Unit (AB) | 10 | 20 | 40 | 20 | 22 | — | 100 |
| Unit (A) | 90 | 80 | 60 | 80 | 78 | — | 0 |
| Luminous brightness (cd/m$^2$) | 6600 | 8500 | 6000 | 8000 | 8100 | 0 | 400 |
| Half-life (minutes) | ≧100 | ≧100 | ≧100 | ≧100 | ≧100 | 0 | 5 |

*3 Molar ratio of the structural unit of Unit (AB) and the structural unit of Unit (A)

As can be seen from Table 2, the electroluminescent cells of Examples 1–5 exhibited a higher luminous efficiency and more excellent durability than the electroluminescent cells of Comparative Examples 1 and 2.

The electroluminescent material of the present invention can produce an electroluminescent cell which exhibits a high luminous efficiency and excellent durability. The electroluminescent cell of the present invention not only exhibits a high luminous efficiency, but also has excellent durability.

Obviously, numerous modifications and variations of the present invention are possible in light of the above teachings. It is therefore to be understood that, within the scope of the appended claims, the invention may be practiced otherwise than as specifically described herein.

What is claimed is:

1. An electroluminescent material, comprising:
    a unit (AB)n which is formed by alternate copolymerization of a hole transfer monomer and an electron transfer monomer; and
    a unit (A)m which is formed by the polymerization of a hole transfer monomer;
    wherein the molar ratio of the total of the structural units originating from the hole transfer monomers and the structural units originating from the electron transfer monomers in the unit (AB)n, and the structural units originating from the hole transfer monomers in the unit (A)m is from 50:50 to 5:95; and
    wherein a total molar ratio of unit (AB)n and unit (A)m is 100.
2. The electroluminescent material according to claim 1, which is a block copolymer formed from a block component of unit (AB)n and a block component of unit (A)m.

3. The electroluminescent material according to claim 1, which is a resin composition comprising a copolymer formed from unit (AB)n and a polymer formed from unit (A)m.

4. The electroluminescent material according to claim 1, which is a resin composition comprising a block copolymer formed from a block component of unit (AB)n and a block component of unit (A)m, a copolymer formed from unit (AB)n, and a polymer formed from unit (A)m.

5. The electroluminescent material according to claim 1, wherein said hole transfer monomer is a carbazole derivative selected from the group consisting of N-vinylcarbazole, 3,6-dimethyl-9-vinylcarbazole, 3,6-diethyl-9-vinylcarbazole, 3-methyl-9-vinylcarbazole and 3-ethyl-9-vinylcarbazole.

6. The electroluminescent material according to claim 1, wherein said electron transfer monomer is an oxadiazole derivative selected from the group consisting of 2-β-naphtyl-5-(4-vinylphenyl)- 1,3,4-oxadiazole, 2-α-naphtyl-5-(4-vinylphenyl)- 1,3,4-oxadiazole, 2-phenyl-5-(4-vinylphenyl)-oxadiazole and 2-(p-phenyl)-5-(4-vinylphenyl)-oxadiazole.

7. The electroluminescent material according to claim 1, wherein the molar ratio of the total of the structural units originating from the hole transfer monomers and the structural units originating from the electron transfer monomers in the unit (AB)n, and the structural units originating from the hole transfer monomers in the unit (A)m is from 40:60 to 10:90.

8. The electroluminescent material according to claim 1, wherein the molar ratio of the total of the structural units originating from the hole transfer monomers and the structural units originating from the electron transfer monomers in the unit (AB)n, and the structural units originating from the hole transfer monomers in the unit (A)m is a ratio selected from the group consisting of 10:90, 20:80, 40:60 and 22:78.

9. An electroluminescent cell, comprising:

an anode layer;

a hole transfer layer made from the electroluminescent material according to claim 1;

an electron transfer luminous layer; and a cathode layer.

10. An electroluminescent cell, comprising:

an anode layer;

an electroluminescent material layer made from the electroluminescent material according to any one of claims 1 to 4;

an electron transfer luminous layer; and a cathode layer.

11. An electroluminescent cell, comprising:

an anode layer;

an electroluminescent material layer made from the electroluminescent material according to claim 1;

an electron transfer luminous layer; and a cathode layer;

wherein said anode layer is provided on a transparent substrate.

12. The electroluminescent cell according to claim 4, wherein said electroluminescent material layer is provided on said anode layer.

13. The electroluminescent cell according to claim 11, wherein said electron transfer luminous layer is provided on said electroluminescent material layer.

14. The electroluminescent cell according to claim 11, wherein said cathode layer is provided on said electron transfer luminous layer.

15. The electroluminescent cell according to claim 11, wherein said anode layer and said cathode layer are connected to a DC power source.

16. The electroluminescent cell according to claim 11, wherein said transparent substrate is a substrate selected from the group consisting of a transparent resin substrate, a quartz glass and a glass substrate.

17. The electroluminescent cell according to claim 11, wherein said anode layer comprises a material selected from the group consisting of an ITO membrane, a tin oxide membrane, a copper oxide membrane and a zinc oxide membrane.

18. The electroluminescent cell according to claim 11, wherein said electron transfer luminous layer comprises a material selected from the group consisting of a metal complex of hydroxyquinoline, a metal complex compound of hydroxybenzoxazole and a metal complex compound of hydroxybenzthiazole.

19. The electroluminescent cell according to claim 18, wherein said metal complex of hydroxyquinoline is tris-quinolinolate aluminum.

20. The electroluminescent cell according to claim 11, wherein said cathode layer comprises a material selected from the group consisting of an aluminum membrane, a calcium membrane, a magnesium membrane, a lithium membrane and a metal alloy comprising aluminum, calcium, magnesium, and lithium.

21. The electroluminescent material according to claim 2, wherein said unit (AB)n has a weight average polymerization degree of 5 to 5,000.

22. The electroluminescent material according to claim 2, wherein said unit (A)m has a weight average polymerization degree of 10 to 5,000.

23. The electroluminescent material according to claim 2, wherein said block copolymer has a polystyrene-reduced weight average molecular weight of 10,000 to 500,000.

* * * * *